(12) United States Patent
Li et al.

(10) Patent No.: US 7,358,603 B2
(45) Date of Patent: Apr. 15, 2008

(54) HIGH DENSITY ELECTRONIC PACKAGES

(75) Inventors: Che-Yu Li, Homer, NY (US); Matti A. Korhonen, Ithaca, NY (US)

(73) Assignee: Che-Yu Li & Company, LLC, Homer, NY (US)

( * ) Notice: Subject to any disclaimer, the term of this patent is extended or adjusted under 35 U.S.C. 154(b) by 96 days.

(21) Appl. No.: 11/463,740

(22) Filed: Aug. 10, 2006

(65) Prior Publication Data

US 2008/0036071 A1 Feb. 14, 2008

(51) Int. Cl.
*H01L 23/04* (2006.01)
*H01L 23/48* (2006.01)
*H01L 23/12* (2006.01)
*H01L 23/053* (2006.01)

(52) U.S. Cl. .................. 257/698; 257/697; 257/700; 257/E23.005

(58) Field of Classification Search .......... 257/693, 257/697, 698, 700, E23.005
See application file for complete search history.

(56) References Cited

U.S. PATENT DOCUMENTS

| | | | |
|---|---|---|---|
| 2,153,177 A | 4/1939 | Ecker | |
| 3,317,885 A | 5/1967 | Yost | |
| 3,513,434 A | 5/1970 | Zielke | |
| 3,795,884 A | 3/1974 | Kotaka | |
| 4,029,375 A | 6/1977 | Gabrielian | |
| 4,810,213 A | 3/1989 | Chabot | |
| 4,838,815 A | 6/1989 | Tajima et al. | |
| 4,922,376 A | 5/1990 | Pommer et al. | |
| 5,030,109 A | 7/1991 | Dery | |
| 5,061,191 A | 10/1991 | Casciotti et al. | |
| 5,101,553 A | 4/1992 | Carey | |
| 5,127,837 A | 7/1992 | Shah et al. | |
| 5,215,472 A | 6/1993 | DelPrete et al. | |
| 5,228,861 A | 7/1993 | Grabbe | |
| 5,232,372 A | 8/1993 | Bradley et al. | |
| 5,308,252 A | 5/1994 | Mroczkowski et al. | |
| 5,427,535 A | 6/1995 | Sinclair | |
| 5,473,510 A | 12/1995 | Dozier, II | |

(Continued)

OTHER PUBLICATIONS

COSMOS Customer Successes; COSMOS helps analyze circuit board connectors; Internet pages; http://mcad.cosmosm.com/pages/successes/electronics7.html (4 pages), no date available.

(Continued)

*Primary Examiner*—Ngân V. Ngô
(74) *Attorney, Agent, or Firm*—Brown & Michaels, PC (57) ABSTRACT

A high-density electrical package utilizing an array of high performance demountable electrical contacts such as UEC, T-Spring, F-Spring and their equivalent contained in a carrier in the form of an interposer between one or more components and a substrate. The carrier is made of a thermally conductive metal or contains thermally conductive metal to provide heat-spreading or dissipation functions in addition to the function of the retention and alignment of the electrical contacts. The above interposer is used for chip attach for a single chip or a stack of chips in the package. The interposer provides electrical connections through individual electrical contact to another chip or to the substrate of the package. It provides also the heat spreading or dissipation function to the chips connected thermally to a particular interposer. The interposer can further be connected thermally to an external heat spreader when necessary.

20 Claims, 5 Drawing Sheets

U.S. PATENT DOCUMENTS

| | | | |
|---|---|---|---|
| 5,653,598 | A | 8/1997 | Grabbe |
| 5,791,914 | A | 8/1998 | Loranger et al. |
| 5,800,184 | A | 9/1998 | Lopergolo et al. |
| 5,806,181 | A | 9/1998 | Khandros et al. |
| 5,823,792 | A | 10/1998 | Regnier |
| 6,074,219 | A | 6/2000 | Tustaniwskyj et al. |
| 6,142,789 | A | 11/2000 | Nolan et al. |
| 6,247,938 | B1 | 6/2001 | Rathburn |
| 6,264,476 | B1 | 7/2001 | Li et al. |
| 6,471,554 | B2 | 10/2002 | Armistead et al. |
| 7,014,479 | B2 | 3/2006 | Li |
| 7,029,288 | B2 | 4/2006 | Li |
| 7,029,289 | B2 | 4/2006 | Li |
| 7,040,902 | B2 | 5/2006 | Li |
| 2005/0048807 | A1 | 3/2005 | Li |
| 2005/0191906 | A1 | 9/2005 | Li |
| 2006/0094269 | A1 | 5/2006 | Li |
| 2006/0141814 | A1 | 6/2006 | Li |
| 2006/0141815 | A1 | 6/2006 | Li |
| 2006/0141832 | A1 | 6/2006 | Li |
| 2006/0189176 | A1 | 8/2006 | Li |
| 2006/0211276 | A1 | 9/2006 | Li |
| 2007/0099445 | A1 | 5/2007 | Li |
| 2007/0105406 | A1 | 5/2007 | Li |
| 2008/0001271 | A1* | 1/2008 | Marcinkiewicz ............ 257/678 |

OTHER PUBLICATIONS

Button Contacts for Liquid Nitrogen Applications; Frank Almquist; IBM Corporation; 0569-5503/89/0088, IEEE, pp. 88-91, no date available.

A Novel Elastomeric Connector for Packaging Internconnections, Testing and Burn-in Applications; D. Y. Shih et al.; 0569-5503/95/0000-0126; 1995 IEEE; pp. 126-133, no date available.

PC-nonlinear FEA makes the connection; Design News; Internet pages from www.designnews.com (4 pages); Dec. 23, 2004.

CIN::APSE High Speed Interconnect Technology; Brochure; 5 pages, no date available.

An Adaptable, High Performance LGA Connector Technology; HCD, Inc.; Dirk D. Brown et al.; 6 pages, no date available.

Two Fundamental Approaches to Enabling High Performance LGA Connectors; HCD, Inc.; Dirk D. Brown et al.; pp. 508-514, no date available.

Wafer-level CSP, Wafer-Level Asemblyltest: Integrating Backend Processes; Solid State Technology; John Novitsky et al.; Internet page http://solidstate.articles.printhis.clickability.com; 7 pages, no date available.

Z-Axis Interconnection for 3-D High Density Packaging; 2001 International Symposium on Microelectronics; S. Spicsshoefor et al.; pp. 167-171, no date available.

HCD—High Connection Density, Inc. Corporate Overview; 6 pages, no date available.

Modular Subsystems and High Frequency Solutions; Connector and Socket Product Overview; HCD—Hiah Connection Density, Inc.; Apr. 2004; 12 paaes, no date available.

SuperButton Land Grid Array (LGA) Production IC Sockets; HCD—High Connection Density, Inc.; www.hcdcorp.com, 1 paae, no date available.

Customable Multi-Contact-Point Interposer, IBM Technical Disclosure Bulletin; Apr. 1994; pp. 105-106.

Special Thermal Conductive Interposers; IBM Technical Disclosure Bulletin; Sep. 1993; pp. 7-8.

Passive Interposer Connection Scheme; IBM Technical Disclosure Bulletin; May 1993; pp. 249-252.

Compressible-Contact Interconnection Scheme; IBM Technical Disclosure Bulletin; Oct. 1990; pp. 394-395.

Improved Interconnection Structure; IBM Technical Disclosure Bulletin; Nov. 1988; pp. 17-19.

Interposer Carrier, IBM Technical Disclosure Bulletin; Jan. 1987; pp. 3678-3680.

Electrically Conductive Array in an Elastomeric Material; IBM Technical Disclosure Bulletin; Sep. 1982; pp. 1801-1802.

High Density Area Array Connector, IBM Technical Disclosure Bulletin; Apr. 1991; pp. 4-5.

* cited by examiner

Prior Art

Fig.6

Prior Art

Test Circuit

Fig. 12d

HIGH DENSITY ELECTRONIC PACKAGES

BACKGROUND OF THE INVENTION

1. Field of the Invention

The invention pertains to the field of high-density electronic packaging. More particularly, the invention pertains to electrical contacts for high-density connectors, interposers and chip-level packaging.

2. Description of Related Art

High-density electronic package can be designed in two ways separately or in combination. One of the ways is to make the size of or the area occupied by the package not much larger than that of the chip or die in the package. This approach allows the highest package density in 2-D therefore the device density in a given system space. Chip-scale package is an example of such an approach.

The other way or approach is to pack as many dies or devices as possible in a package. A way to do this is to stack the chips or dies in a package while maintaining the area occupied by the package about the same.

Chip-scale package with stacked chips or dies is an example of high-density package that combines the above two approaches at the same time.

To meet the desire of achieving high device or package density further one can stack the packages together while keeping the area occupied about the same.

The sub-packages with stacked dies and stacked sub-packages can also be packed together in a package either arranged in 2-D or 3-D in a system-in or on-package approach to achieve even more packing density.

In current practice the die or chip is attached in the above by either wire bonding or flip-chip solder joint. Thus the design of the above packages will differ depending on the method of die-attach.

Currently the micro-BGA (Ball Grid Array) external connection of a chip-scale package has a limited number of I/O (about 200 or less) as the result of lack of thermal-mechanical reliability. The wire bonding commonly used for die attaches whether for a single die or stacked dies in a chip-scale package suffers from being an inductive electrical connection with limited electrical conductance.

Whether one uses wire bonding or flip-chip solder joint for die-attach they are not reworkable. The BGA or micro-BGA solder joint commonly used for package stacking is not reworkable. Thus costly known-good-die and known-good-package are necessary in the above approaches to achieve acceptable yield especially in a system-in-package approach.

In prior art high-density packages there is not any convenient way to cool a die in a stacked structure or to attach a heat spreader to a die in the same. Thus chips such a microprocessor that requires high heat dissipation capacities cannot be packaged easily in a stacked package whether for die or package stacking.

There is therefore a desire to use demountable connections in die-attach and in package stacking to enhance yield and reduce cost in high-density packages. The demountable connections such as UEC offer also high performance in terms of frequency and current, high service temperatures, as well as larger I/O arrays at finer contact pitches.

There is a desire to solder electrical contact such as UEC at both ends or wire-bond (thermal-sonic-compression-bond) at one end and solder at the other end to achieve a small stack height of a package. Such connections allow test first followed by assembly for high yield.

There is also a desire to be able to provide high capacity heat spreader attached to dies in a stacked structure of high-density packages.

Figure 1:
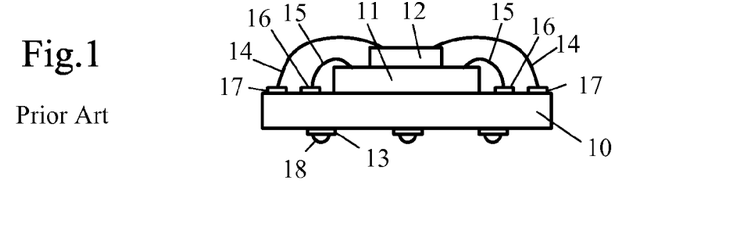
FIG. 1 shows a prior art chip-scale or high-density package with stacked dies.

FIG. 1 depicts a typical prior art chip-scale or high-density package with a single chip or a stack of chips, in this case two chips (11) and (12). The chips are connected by wire bonds (14) and (15) from the bonding pads on the chip to the bonding pads (16) and (17) on the substrate (10) of the package. The substrate (10) is usually made of epoxy/glass composite. A number of ways have been used in the prior art for connecting or routing the bonding pads (16) and (17) on the backside of the substrate (10) of the package to the contact pads (13) on its front face to achieve high-density or chip-scale packaging.

The contact pads (13) on the front face of the package are typically connected to the contact pads on the main board by micro-ball-grid-array or micro-BGA solder joints (18).

The prior art shown in FIG. 1 suffers from:

Inductive long bonding wires (14) and (15).

Lack of heat spreading or dissipation capabilities.

Limited number of I/O allowed by micro-BGA solder joint external connection to avoid thermal expansion coefficient mismatch failure.

The use of the prior art in FIG. 1 is primarily concentrated in memory chip packaging where the I/O number is low and heat dissipation requirements are limited.

Figure 2:
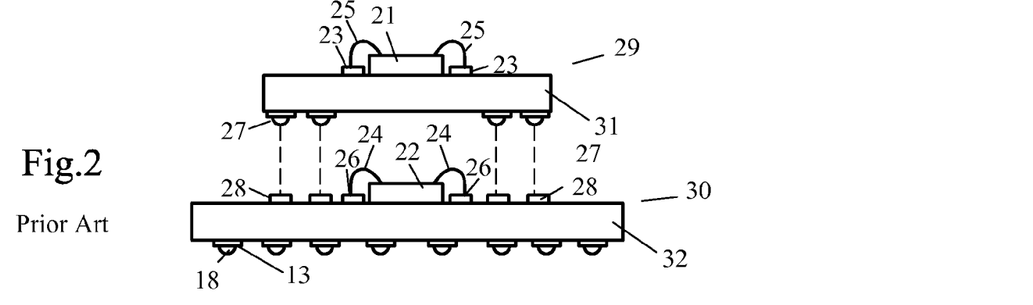
FIG. 2 shows a prior art stacked chip-scale or high-density sub-packages

FIG. 2 shows a typical prior art package using stacked chip-scale or high-density sub-packages. In the version shown in FIG. 2, there are two sub-packages, an upper sub-package (29) and a lower sub-package (30). The upper sub-package (29) is essentially the same as a single-chip embodiment of the design of FIG. 1, with a chip (21) on a substrate (31), having wire bonds (25) connecting the chip (21) to contact pads (23) on the upper surface of the substrate (31). A second chip (22) is located on the lower sub-package (30), bonded by wires (24) to contact pads (26) on top of the substrate (32) of the lower sub-package (30).

The stacking of the sub-packages is achieved by connecting electrically the contact pads (27) on the lower face of the upper sub-package (29) to the contact pads (28) on the upper face of the lower sub-package (30) by ball-grid-array or BGA solder joint or micro-BGA solder joint. To avoid height interference the chip (22) may sit in a cavity in the substrate (32) of the lower sub-package (30).

The external contact pads (13) of the package are connected to the same on the main board by BGA or micro-BGA solder joint (18), as in FIG. 1. The stacked packages of FIG. 2, although achieving higher density, do not avoid the limitations of the package in FIG. 1.

Figure 3:
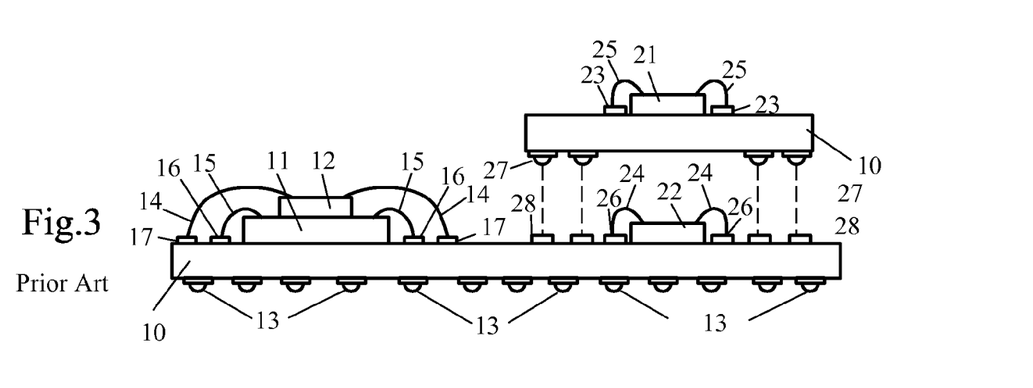
FIG. 3 shows a prior art system-in-package with a combination of high-density sub-packages in 2-D.
Figure 4:
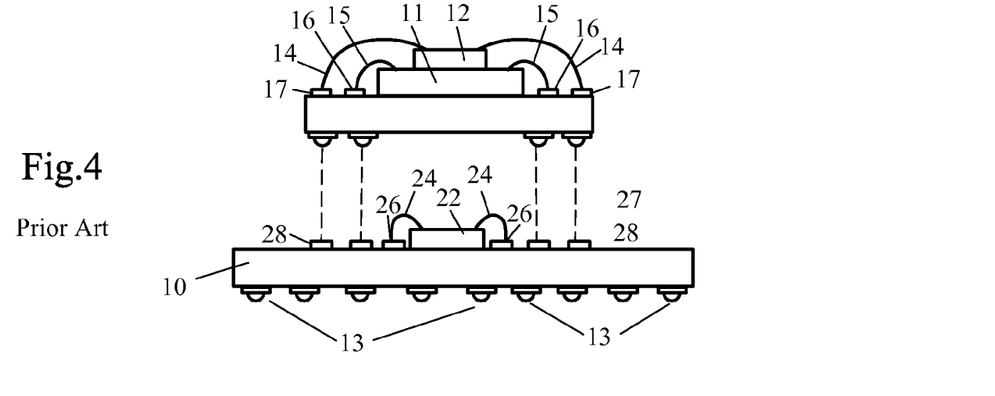
FIG. 4 shows a prior art system-in-package with a combination of high-density sub-packages in 3-D.

FIGS. 3 and 4 show prior art examples of system-in-package designs where the packages in FIGS. 1 and 2 are packaged in combination in 2-D and/or 3-D. The methods of connection used in such a complex package include wire bonding, BGA and micro-BGA. These methods all provide permanent connections. Thus known-good-die (KGD) and known-good-package (KGP) testing methods are highly desirable here to increase yield and reduce cost. It should be recognizes that KGD and KGP carry extra testing cost in themselves.

Figure 5:
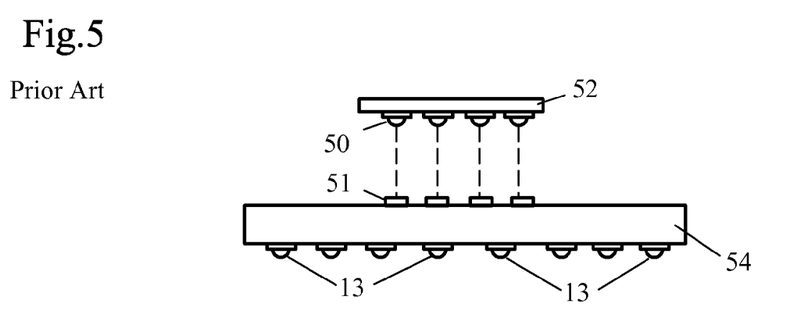
FIG. 5 shows a prior art chip-scale or high-density package with flip-chip solder joint die attach.

FIG. 5 depicts a prior art single chip chip-scale or high-density package in which chip (52) attach is made by using flip-chip solder joint (50) between the chip (52) and the contact pads (51) on the upper surface of the substrate (54) of the package.

Flip-chip solder joint without under-fill protection from thermal expansion coefficient mismatch damages suffers also from low I/O numbers. A ceramic substrate of the package may be used for low thermal expansion coefficient mismatch, but this approach is costly.

Currently flip-chip solder joint has not been used commercially for chip stacking in a high-density package. In a system-in-package design a mixture of die attach by wire bonding and by flip-chip solder joint are often seen.

Figure 6:
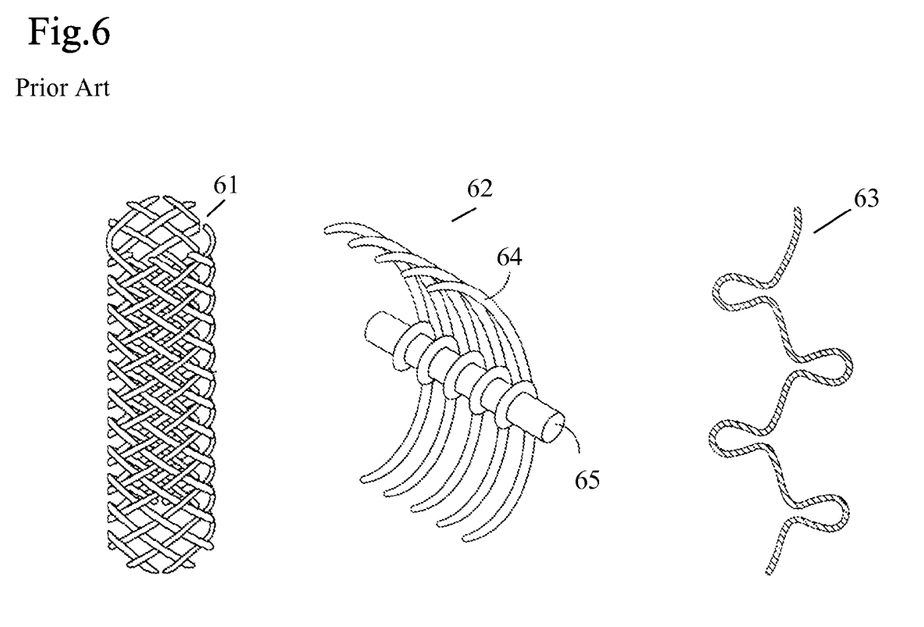
FIG. 6 shows three prior art high performance demountable electrical contacts.

FIG. 6 shows three high performance demountable electrical contacts that are suitable for electrical connection in high-density electronic package of the present invention. These connectors will be referred to as the "Universal Electrical Contact" (61) hereinafter "UEC"), "Torsion-Spring contact" (62) (hereinafter "T-Spring"), and "Folded-Spring contact" (63) (hereinafter "F-Spring"). The electrical contact UEC is described in four prior US patents granted to the present inventor: U.S. Pat. No. 7,040,902, "Electrical Contact", and three Continuations-in-Part—U.S. Pat. No. 7,014,479, "Electrical Contact and Connector and Method of Manufacture", U.S. Pat. No. 7,029,288, "Electrical Contact and Connector and Method of Manufacture", and U.S. Pat. No. 7,029,289. The T-Spring is described in co-pending U.S. patent application Ser. No. 11/264,803, entitled "Electrical Contact Assembly and Connector System", filed Nov. 1, 2005, and the F-Spring is described in co-pending U.S. patent application Ser. No. 11/334,993, entitled "Electrical Contact and Connector System", filed Jan. 18, 2006. The contents of the aforementioned patents and patent applications are incorporated here by reference.

The UEC (61) has a multiple conductive wire braided cylindrical structure as shown in FIG. 6. The T-Spring (62) is made of multiple conductive one-turn torsion springs (64) operating in parallel mounted on a conductive mandrel (65). The F-Spring (63) as shown in FIG. 6 is a conductive folded beam. Alternatively, a bank or bundle of multiple conductive wires can be attached together and made into the same shape.

All the above electrical contacts have approximately the same performance, although manufacture of the UEC and F-Spring may be simpler at the small size required for chip attach.

The performance advantages of the UEC include:
Elastic compliance of 30% or more of uncompressed height and average contact force in an array 20 gr. per UEC or less.
10 milliohm or less total resistance per UEC in contact with solder bump or contact pad.
10 GHz or more frequency capability.
1 million-touchdown durability.
Service temperature >250 degree C.
High reliability.
Interposer contact pitch to 10 mil or less with I/O to 5000 or more and ends solderable and wire-bondable.

The possible sizes of these electrical contacts, and the elastic compliance achievable, are the key reasons that these demountable electrical contacts are able to replace BGA, micro-BGA, and flip-chip solder joints and more in high-density packages. The option that the ends of the electrical contacts can be soldered or wire-bonded offers additional convenience in the design of a high-density package.

FIGS. 7a through 7d show a preferred method of manufacturing and design of an interposer using the UEC. An interposer is designed to retain and align an array of demountable electrical contacts for mating with corresponding contact pads on the face of the two components to be connected electrically. It will be understood by one skilled in the art that a similar method might be used with T-spring or F-spring interposers.

Typically the carrier is made of polymer or polymer composite. The electrical contacts are inserted into an array of holes in a required pattern in the carrier. The retention of the electrical contacts is achieved with adhesives or mechanical means or both. Appropriate alignment holes are also drilled in the carrier to align the electrical contact to corresponding contact pads.

SUMMARY OF THE INVENTION

The present invention is a high-density electrical package utilizing an array of high performance demountable electrical contacts such as UEC, T-Spring, F-Spring and their equivalent contained in a carrier in the form of an interposer between one or more components and a substrate. The carrier is made of a thermally conductive metal or contains thermally conductive metal to provide heat-spreading or dissipation functions in addition to the function of the retention and alignment of the electrical contacts.

The above interposer is used for chip attach for a single chip or a stack of chips in the package. The interposer provides electrical connections through individual electrical contact to another chip or to the substrate of the package. It provides also the heat spreading or dissipation function to the chips connected thermally to a particular interposer. The interposer can further be connected thermally to an external heat spreader when necessary.

For chip attaching in the present invention the chip with the active side facing down in a flip-chip configuration has an array of contact pads on the same face to mate with the corresponding electrical contacts in the interposer. The other end of the electrical contact will mate with contact pads on the substrate of the package in a single chip package or for the lowest chip in a stack of chips. The other end of the electrical contact will mate with the contact pads on the backside of a lower chip in a stack of chips.

An appropriate clamping mechanism consisting of a clamping plate, clamping pins and corresponding receptacles located on the substrate of the package is used to clamp a single chip or a stack of chips against the substrate of the package to provide alignment and the contact force required for demountable electrical contact thus completing the assembly of the package.

For chip stacking in the above embodiments a chip must contain through-thickness via that connect electrically the contact pads on the two faces of the chip. The making of such via is a well-practiced prior art.

Finally an interposer containing demountable electrical contacts in an appropriate array design maybe used to electrically connect the package to the main board. In general such connections avoid failure caused by thermal expansion coefficient mismatch between the package and the main board.

For convenience one end of the electrical contact maybe solder connected or wire-bonded to a part while the other end of the electrical contact provides the demountable function.

To avoid making chips containing through-thickness via, chip attach can still be made by using conventional methods such as wire bonding and flip-chip solder joint. High-density package can made according to the present invention by stacking the sub-packages together with the interposer containing demountable electrical contact. In these embodiments the chips can be conveniently connected thermally to the interposer for heat spreading.

To reduce the height of package stack the electrical contact can be soldered or wire bonded to the component to be attached first. The electrical contact thus connected is used for testing followed by solder connect at the other end.

Of course in a system-in-package design one may use a mixture of chip attaching methods as long as one can achieve high yield, high performance and low cost.

DETAILED DESCRIPTION OF THE INVENTION

The invention comprises a high-density electrical package using interposers with thermally-conductive carriers between one or more components and a substrate.

In the present invention for the purpose of better alignment and heat spreading or dissipation, the carrier is preferably made of sheets of conductive metals such as copper and copper alloys with etched holes. Photo etching is preferred to produce hole dimensions and locations with better precision. The conductive metal sheet provides heat spreading or dissipation when a chip is thermally connected to the carrier. The sheet can also provide thermal connections to an external heat spreader.

A method of making a UEC interposer based on the above design is shown in FIGS. 7a-7d.

The carrier (78) is made of two coated conductive metal sheets (71) and (72) with appropriately etched holes (77). Each conductive metal sheet (71) and (72) is coated with insulator and adhesive (76) as shown in FIGS. 7a to 7d. The insulator and adhesive can be the same material. The former insulates the electrical contacts from each other and the latter provides retention.

Figure 7A:
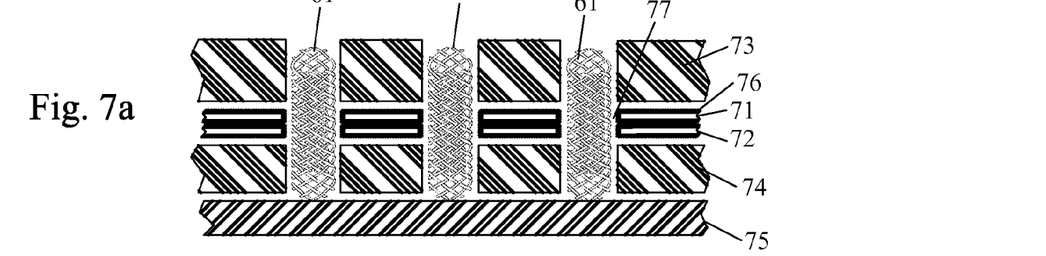
FIGS. 7a to 7d show a method of making a UEC interposer with a carrier based on thermally conductive metals.

In the first step of manufacturing, shown in FIG. 7a, the two coated sheets (71) and (72) are placed in a lamination stack as shown. The lamination stack consists of an upper stack (73), a lower stack (74), and a bottom plate (75). Holes (77) of the same dimensions and array are drilled in upper (73) and lower (74) stack as those in the carrier sheets (71) and (72). The height of the stack is such that when UECs (61) are inserted into the holes (77), the top of the UECs (61) are below the top of the stack.

Figure 7B:
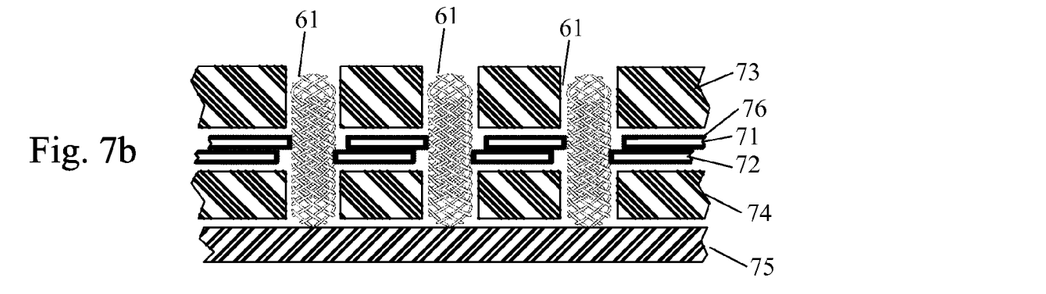

The dimensions or the diameter of the holes (77) are larger than the diameter of UECs (61) to facilitate easy insertion, which may not favor alignment. The carrier (78) is designed to allow the shifting the upper sheet (71) and the lower sheet (72) relative to each other after UEC (61) insertion to produce an opening with a tighter fit with the UEC (61), as shown in FIG. 7b.

Figure 7C:
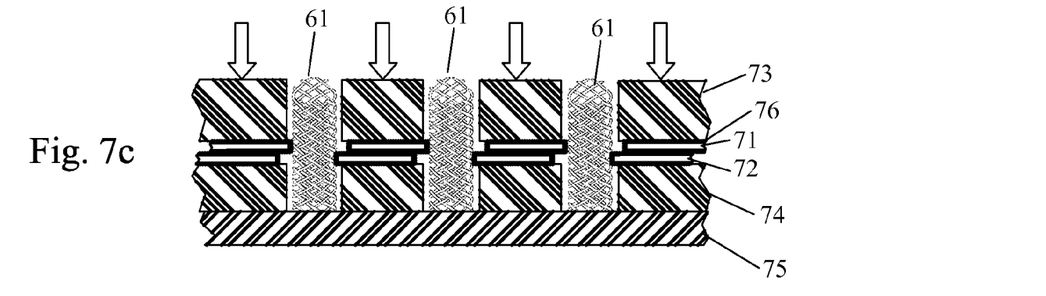

As shown in FIG. 7c, after the insertion of the UECs (61) and the shifting the two sheets (71) and (72), pressure and temperature are applied to the stack to laminate the two sheets together and squeeze the adhesive (76) to the hole for required retention.

Figure 7D:
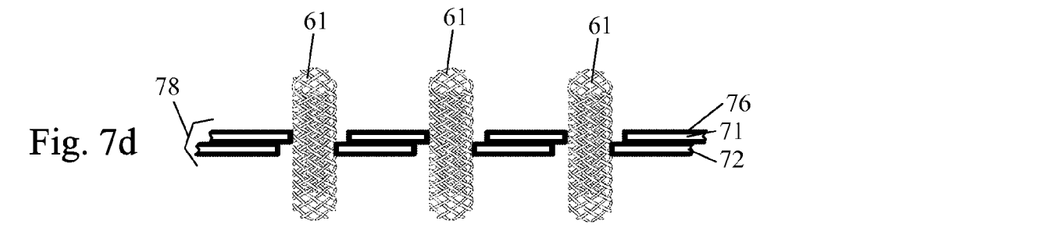

The upper stack (73), lower stack (74) and plate (75) may then be removed, leaving the carrier (78) with the UECs (61), as shown in FIG. 7d.

Figure 8:
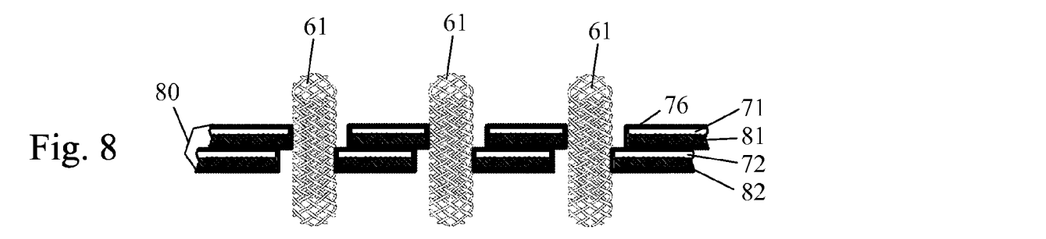
FIG. 8 shows an interposer made of polymer or polymer composite containing thermally conductive metal sheets for heat spreading or dissipation.

FIG. 8 depicts a polymer or polymer composite carrier (80) designed in the same way as that in FIG. 7. For the purpose of heat spreading or dissipation conductive metal sheets (71) and (72) are laminated onto the polymer or polymer composite sheet (81) and (82), respectively, followed by a coating of insulation and adhesive (76), as in the embodiment of FIGS. 7a-7d.

The manufacturing of UEC interposer with the above carrier is done in the same way as that in FIGS. 7a-7d. The polymer or polymer composite carrier can be used adequately for interposer with a larger contact pitch.

Figure 9:
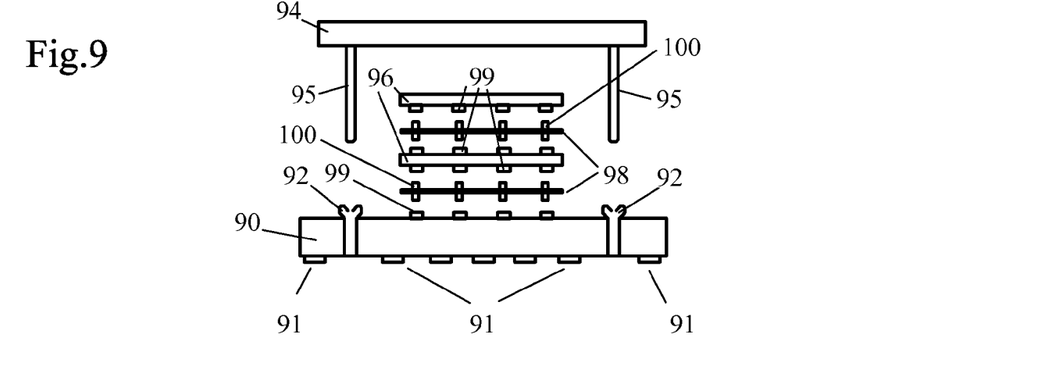
FIG. 9 shows a chip-scale or high-density package with stacked chips attached by interposers containing demountable electrical contacts.

FIG. 9 shows a high-density package with stacked chips connected by interposers with high performance demountable electrical contacts.

It should be noted here that the following descriptions will use the term "chips" or "dies" or "sub-packages" to describe that which is packaged. It will be understood that in fact, these terms are taken to mean the components to be packaged in the package of the invention—that is, any assembly of active and/or passive electronic components and associated circuitry and carriers, rather than intending to limit the invention to application to just integrated circuit chips as such.

The embodiment of FIG. 9 has two dies (96) with the chips (or devices) to be packaged. The active face of the chip may face down in a flip-chip configuration.

Contact pads (99) provide connections to the dies (96) and the substrate (90). The dies (96) may contain through-thickness vias connecting the contact pads (99) on both faces of the dies (96), allowing easy electrical connection from an upper chip, etc., through the die (96), without the need for external connection wires.

Between the two dies (96) and between the lower die (96) and substrate (90) are thermally conductive interposers (98) with contacts (100). The interposers (98) are constructed as described in detail above, and the contacts (100) are preferably UECs, T-springs or F-springs, although other designs are possible.

A clamping plate (94) has clamping pins (95) which slip into, and are locked by, clamping receptacles (92). The clamping pins (95) may, of course, also be located on the substrate (90), locking into receptacles (92) on the clamping plate (94), if desired.

Thus, by assembling the dies (96) and interposers (98) in place, and pressing the clamping plate (94) down over the assembly, the pins (95) lock into the receptacles (92), applying pressure to ensure good contact between the contact pads (99) and the connectors (100). An appropriately designed guide template may be required (not shown) to align contact pads with corresponding electrical contacts in the stack.

In the present invention, the external contact pads (91) of the package are preferably electrically connected to contact pads on a main board (not shown) by an interposer containing demountable electrical contacts to allow a larger I/O array without suffering the damage of thermal expansion coefficient mismatch.

The thermally conductive carrier provides convenient heat spreading or dissipation for the chips in the stack. The capacity of such heat spreading can be adequate for the needs of a high powered microprocessor that has not be possible in prior art package with stacked chips. It will be understood that this same embodiment may be used with different numbers of chips or sub-packages than the two shown for example in the figure, within the teachings of the invention.

To solder connect UECs without the interposer; the upper and lower stack (73,74) can be combined to form a guide template to align the UEC for soldering. In this application the height of guide template will be smaller than the height of UEC.

When a template is used for aligning UEC before soldering after one end is soldered the UEC is sufficiently aligned in that state. One may remove the template. Two choices are available. a) The other end can be soldered without a carrier if there is not a need for heat dissipation. b) One may insert a carrier for heat dissipation before soldering the other end. If one end of UEC is wire-bonded the UEC will be sufficiently aligned. Two choices are available again. a) Solder the other end without a carrier. b) Insert a carrier before soldering the other end. When UEC is in a carrier of the interposer it can be soldered one end first or both ends at the same time.

Figure 10:
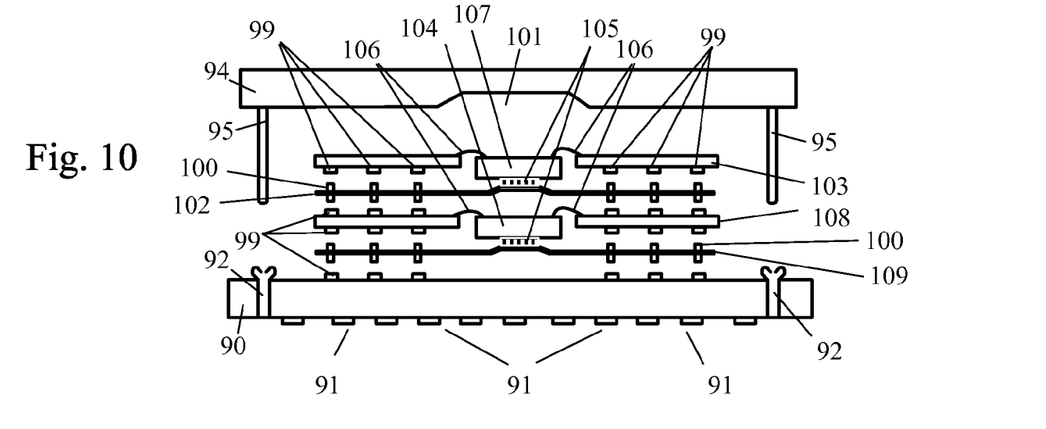
FIG. 10 shows stacked chip-scale or high-density sub-packages by using interposers containing demountable electrical contacts with chips attached by wire bonding and thermally connected to the interposer.

FIG. 10 shows an embodiment of stacked high-density sub-packages by using an interposer containing demountable electrical contacts.

This embodiment is shown with two chips or dies (104) and (107), each mounted on a sub-package (108) and (103), respectively. The chips are connected to the sub-packages through wire bonds (106). As before, contact pads (99) provide connections to the sub-packages (103) and (108) and the substrate (90). The lower sub-package (108) is shown with through-thickness vias connecting the contact pads (99) on both faces, allowing easy electrical connection from the upper sub-package (103), through the lower sub-package (108) to the substrate (90), without the need for external connection wires.

Between the two sub-packages (103) and (108) between the lower sub-package (108) and substrate (90) are thermally conductive interposers (102) and (109), respectively, with contacts (100). The interposers are constructed as described in detail above, and the contacts (100) are preferably UECs, T-springs or F-springs, although other designs are possible. The chips (104) and (107) are connected thermally, for example by thermally conductive adhesive or grease (105), to the thermally conductive carrier of the interposers (108) and (103) for heat spreading or dissipation.

A clamping plate (94) has clamping pins (95) which slip into, and are locked by, clamping receptacles (92). In this embodiment, a recess (101) is formed in the clamping plate (94) to provide room for the bonding wires (106) of the upper chip (107).

The way the carrier of the interposer to provide heat spreading or dissipation is unique and effective and has not been done in prior art. It will be understood that this same embodiment may be used with different numbers of chips or sub-packages than the two shown for example in the figure, within the teachings of the invention.

Figure 11:
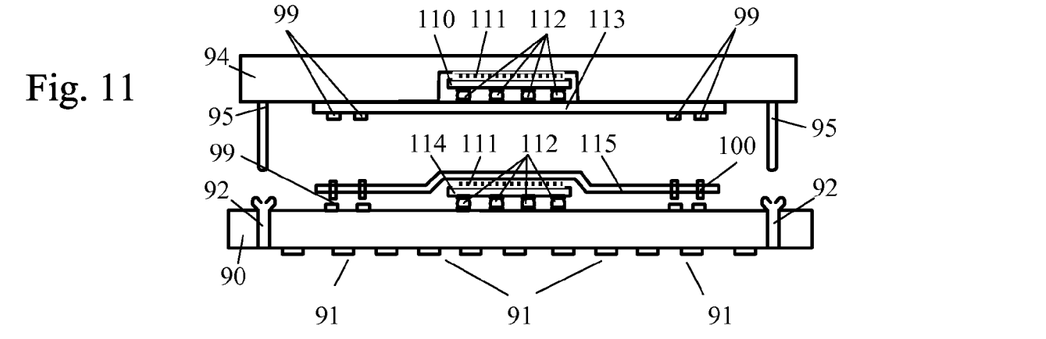
FIG. 11 shows a stacked chip-scale or high-density sub-packages by using interposers containing demountable electrical contacts with chips attached by flip-chip solder joints and thermally connected to the interposer.

FIG. 11 shows another embodiment of stacked high-density packages by using an interposer containing high performance demountable electrical contacts.

Again, two chips (110) and (114) are shown in this figure, although it will be understood that this same embodiment may be used with different numbers of chips or sub-packages than the two shown for example in the figure, within the teachings of the invention. The chips (110) and (114) are connected to the substrate of the sub-package (113) or the substrate (90), respectively, by flip-chip solder joints (112).

The sub-package (113) is connected to the substrate (90) of the package by an interposer (115) with contacts (100) as in FIG. 10. The interposer (115) is slightly shaped to provide good thermal contact (111) between the chip and the carrier for heat spreading or dissipation. The same clamping and alignment mechanism as well as external connections are also used as in FIG. 10. The upper chip (110) can be conveniently connected thermally (111) to the appropriately shaped clamping plate (94) through e.g. thermal grease for the same purposes.

A stacked package for cell phones needs to be extremely thin, which might make the clamping plate and interposer as described above impractical for that application. We can however achieve the benefits of the invention with a modified version of the embodiment of FIG. 10.

This embodiment, as well as a method of making the embodiment, is shown in FIGS. 12a-12d.

For the sake of explanation, the second chip (104), with its associated carrier (108) and interposer (109) which were in FIG. 10 will be omitted from FIGS. 12a-12d, but it will be understood that the steps of the figures may be repeated for additional layers of chips if desired.

Figure 12A:
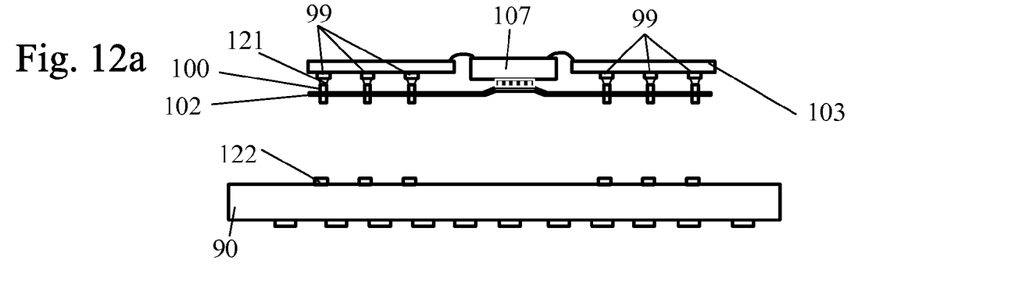
FIGS. 12a-12d show a method of making a version of the package of FIG. 10 without a clamping device.

FIG. 12a) Assemble the upper package (103) and its interposer (102). Solder or wire-bond (121) one end of the UECs (100) on the interposer (102) to the contact pads (99) on the lower surface of the upper package.

Figure 12B:
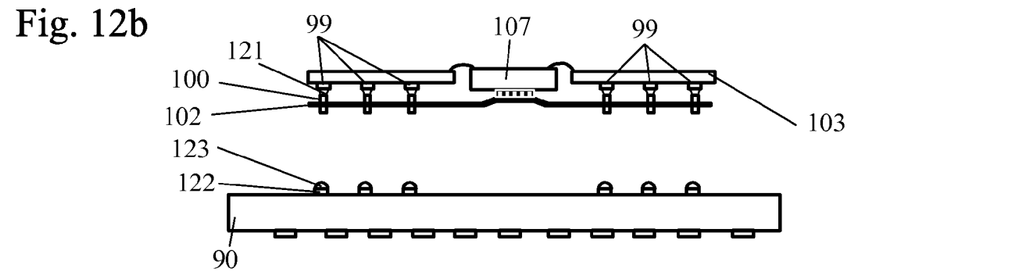

FIG. 12b) Put solder bumps or paste (123) on the contact pads (122) on the upper surface of the substrate (90).

Figure 12C:
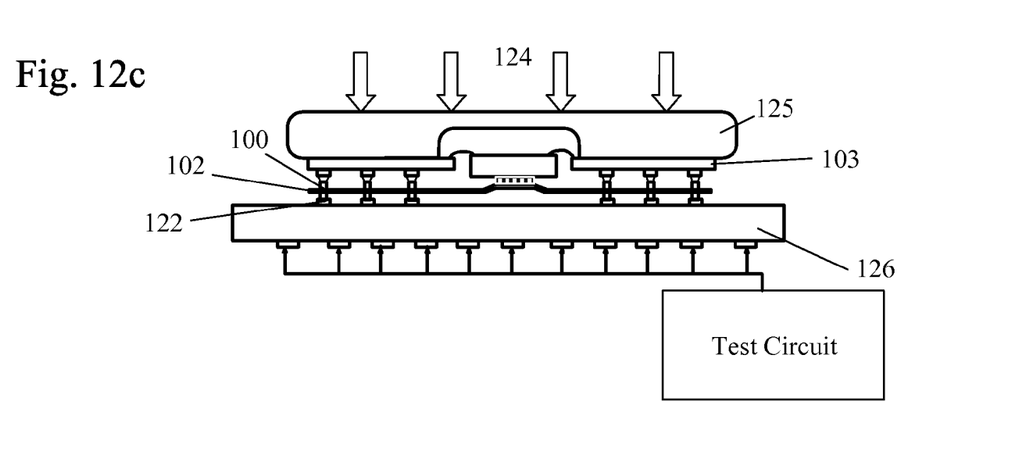

FIG. 12c) Contact the free end of the UECs (100) with the contact pad (122) of the test circuit board (126). Use a suitable fixture (125) to apply a load (124) to the upper package (103). Test the packages electrically using a suitable test circuit (126).

Figure 12D:
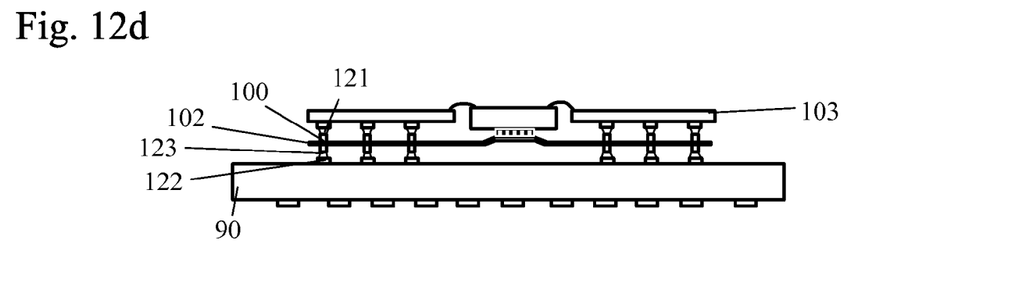

FIG. 12d) If the package has tested good, replace the upper package (103) onto the substrate (90) and reflow the solder bumps or paste (123) on the substrate (90) to make solder joints between the package and the substrate.

This way testing may be done first, and solder joints next, to achieve a thin structure. Alternatively, instead of soldering in step one (FIG. 12a), above, it might be simpler to put solder bumps on the upper package, and perform the following steps without the initial soldering in step one. Then the upper and lower solder bumps can be reflowed in step four (FIG. 12d).

The soldering in the method can be done two ways. In one way the contact is completely embedded in the solder joint. In the other way only the ends are soldered. The mid section remains therefore flexible to take up thermal expansion coefficient mismatch. The later approach is preferred but is slightly more costly.

Also, as an alternative on the connector, the electrical contacts can be made of copper alloys directly instead of copper plated stainless steel which is for higher performance but more costly. Gold flush may be applied to the tip of the contacts to facilitate electrical contact and soldering. Gold flush is made by replacement reaction so that it is cheap. But gold flush cannot withstand repeated touchdowns because it is only a thin layer.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A high density electronic package comprising:
   a) at least one component having an upper surface and a lower surface and a plurality of electrical contact pads on the lower surface of the component;
   b) a substrate having an upper surface and a lower surface, a plurality of electrical contact pads on the upper surface, and a plurality of electrical contact pads on the lower surface,
      at least some of the electrical contact pads on the upper surface of the substrate being electrically coupled to electrical contact pads on the lower surface of the substrate, and
      at least one set of electrical contact pads on the upper surface of the substrate being arranged so that when the at least one component is arranged with the lower surface of the component over the upper surface of the substrate, the electrical contact pads on the lower surface of the component align with the set of electrical contact pads on the upper surface of the substrate; and
   c) an interposer located between the at least one component and the substrate, the interposer comprising:
      i) a thermally conductive carrier, having a plurality of holes passing through the carrier, at least one set of the holes being arranged so that when the interposer is in place between the component and the substrate, the set of holes is aligned with the set of electrical contacts on the upper surface of the substrate which is aligned with the electrical contacts on the lower surface of the component; and
      ii) a plurality of contacts located in the carrier, in thermal communication with the carrier, but electrically isolated from the carrier;
      such that when the interposer is in place between the component and the substrate, the contacts of the carrier make electrical connection between the electrical contact pads on the lower surface of the component and the electrical contact pads on the upper surface of the substrate with which they are aligned.

2. The package of claim 1, in which the contacts of the interposer are UECs.

3. The package of claim 1, in which the contacts of the interposer are T-springs.

4. The package of claim 1, in which the contacts of the interposer are F-springs.

5. The package of claim 1, further comprising a clamping plate adjacent the upper surface of the component and a plurality of clamp pins coupling the clamping plate to the substrate, such that the clamping plate exerts a force pressing the at least one component and the interposer against the substrate.

6. The package of claim 1, further comprising:
   a) at least one intermediate component located between the interposer and the substrate, the intermediate component having an upper surface and a lower surface, a plurality of electrical contact pads on the upper surface of the component and a plurality of electrical contact pads on the lower surface of the component;
   b) an intermediate interposer located between the at least one component and the at least one intermediate component, the intermediate interposer comprising:
      i) a thermally conductive carrier, having a plurality of holes passing through the carrier, at least one set of the holes being arranged so that when the interposer is in place between the component and the substrate, the set of holes is aligned with the set of electrical contacts on the upper surface of the substrate which is aligned with the electrical contacts on the lower surface of the component; and
      ii) a plurality of contacts located in the carrier, in thermal communication with the carrier, but electrically isolated from the carrier;
   such that when the intermediate component and the intermediate interposer are in place between the component and the substrate, electrical contact is maintained from contact pads on the lower surface of the component through the contacts of the intermediate interposer to the electrical contact pads on the upper surface of the intermediate component, and from the electrical contact pads on the lower surface of the intermediate component through the contacts of the interposer to the contact pads on the upper surface of the substrate.

7. The package of claim 6, in which at least some of the electrical contact pads on the upper surface of the intermediate component are electrically coupled to electrical contact pads on the lower surface of the intermediate component.

8. The package of claim 7, in which the electrical contact pads on the upper surface of the intermediate component are electrically coupled to electrical contact pads on the lower surface of the intermediate component by through vias.

9. The package of claim 6, in which the intermediate component is a chip.

10. The package of claim 6, in which the intermediate component is a sub-package comprising at least one chip and a substrate, and the electrical contacts of the intermediate component are on the substrate of the intermediate component.

11. The package of claim 10, in which the at least one chip is connected to the substrate of the intermediate component by wire bonding.

12. The package of claim 10, in which the at least one chip is connected to the substrate of the intermediate component by flip-chip solder joints.

13. The package of claim 1, in which the component is a chip.

14. The package of claim 1, in which the component is a sub-package comprising at least one chip and a substrate, and the electrical contacts of the component are on the substrate of the component.

15. The package of claim 14, in which the at least one chip is connected to the substrate of the component by wire bonding.

16. The package of claim 14, in which the at least one chip is connected to the substrate of the component by flip-chip solder joints.

17. The package of claim 1 in which the plurality of contacts of the carrier are solder connected to electrical contact pads on at least one end.

18. The package of claim 17, in which the plurality of contacts of the carrier are aligned using a guide template before soldering.

19. The package of claim 1, in which the plurality of contacts of the carrier are solder connected at one end and wire bonded at an opposite end.

20. The package of claim 1, in which the plurality of contacts of the carrier are demountably connected at each end.

* * * * *